United States Patent [19]

Guignet

[11] Patent Number: 5,734,572
[45] Date of Patent: Mar. 31, 1998

[54] TOOL WHICH AUTOMATICALLY PRODUCES AN ABSTRACT SPECIFICATION OF A PHYSICAL SYSTEM AND A PROCESS FOR PRODUCING A PHYSICAL SYSTEM USING SUCH A TOOL

[75] Inventor: Jean-Bruce Guignet, Les Clayes s/Bois, France

[73] Assignee: Bull S.A., Louveciennes, France

[21] Appl. No.: 515,572

[22] Filed: Aug. 16, 1995

[30] Foreign Application Priority Data

Aug. 24, 1994 [FR] France ................... 94 10260

[51] Int. Cl.$^6$ ................................ G06F 17/50
[52] U.S. Cl. ............ 364/468.03; 364/489; 364/491; 395/921
[58] Field of Search ............... 364/468.01–468.03, 364/468.09, 468.1, 468.12, 468.13, 468.28, 488–491, 512, 578; 395/183.01, 183.02, 183.13, 919–923

[56] References Cited

U.S. PATENT DOCUMENTS

| | | | |
|---|---|---|---|
| 4,613,940 | 9/1986 | Shenton et al. | 364/490 |
| 5,262,959 | 11/1993 | Chkoreff | 364/489 |
| 5,493,508 | 2/1996 | Dongelo et al. | 364/489 |

OTHER PUBLICATIONS

Kostelijk, "VERA, a Rule-Based Verification Assistant for VLSI Circuit Design", Proceedings of the Internation Conference on Very Large Scale Integration, Munich, Germany. Aug. 1989.

Proceedings of the European Conference on Design Automation 16 Mar. 1992, Brussels, Belgium; pp. 458–462, Deverchere et al, "Functional Abstraction and Formal Proof of Digital Circuits", Deverchere et al.

IEEE Journal of Solid–State Circuits, vol. 26, No. 3, Mar. 1991, NY, US, pp. 394–402; Kostelijk et al. "Automatic Verification of Library–Based IC Designs".

24th ACM/IEEE Design Conference, 1987, "A Rule Based Circuit Representation for Automated CMOS Design and Verification", Wu et al. pp. 786–792.

*Primary Examiner*—Reba I. Elmore
*Assistant Examiner*—Steven R. Garland
*Attorney, Agent, or Firm*—Kerkam, Stowell, Kondracki & Clarke, P.C.; Edward J. Kondracki

[57] ABSTRACT

A tool for verifying a process for producing a physical system by automatically deducing the functional description of the system produced. From the concrete description GND which contains the elements of a physical system and the connections between these elements, the tool automatically deduces the functional description VHD of this system with the aid of an inference engine MOTINF and a filter FILTER. The inference engine selects rules from a library GRL and programmed functions for loading into the filter. Once loaded, the filter regroups the elements of the description GND, thus producing a structural abstraction of the description GND, and simultaneously produces a functional description of each regrouping in formal language. The accumulation of the functional descriptions thus obtained provides the functional description VHD of the system.

20 Claims, 10 Drawing Sheets

TOOL WHICH AUTOMATICALLY PRODUCES AN ABSTRACT SPECIFICATION OF A PHYSICAL SYSTEM AND A PROCESS FOR PRODUCING A PHYSICAL SYSTEM USING SUCH A TOOL

BACKGROUND OF THE INVENTION

The invention relates to a tool which automatically produces an abstract specification of a physical system. The abstract specification of a physical system is a description of the functional behavior of this system. The invention also relates to a process which uses the instant tool to produce a physical system from an abstract specification. The invention is particularly advantageous when the physical system is a complex electronic circuit such as an integrated electrical circuit.

A high-density integrated electrical circuit, currently known by the name VLSI, is constituted by thousands of transistors. A circuit of this type is produced from an abstract specification which is translated into a formal language in order to allow its systematic processing. A CAD (computer-aided design) system transforms the abstract specification into a concrete description of all the elements of the circuit and their interconnections. The elements of the circuit are constituted by transistors which belong to a known technology such as one of the CMOS, BICMOS, bipolar, or AsGa technologies. This concrete description is often called a connection list (netlist) by one skilled in the art. This connection list is then converted into a computer mask description carried by, for example, a magnetic tape. Photographic techniques then make it possible to transfer the physical description of the transistors onto a material substrate.

The manufacture of a circuit comprises a direct chain of events including successive stages of refinement which convert the abstract specification into logic functions, then convert these logic functions into logic gates, and finally convert these logic gates into transistors. These transistors are defined by their geometric shapes and their chemical compositions as materialized in a semiconductor material which embodies the specified circuit. After its fabrication, the circuit is tested in order to assure that it conforms to the original abstract specification.

However, in order to completely assure proper conformity of the circuit with the abstract specification, it is necessary during the test procedure to model all the possible operating modes of the circuit, which quickly becomes difficult, even impossible, for complex circuits. On the other hand, the detection of potential operational errors after the final concretization stage results in increased costs due to the need to make new masks and to discard the unusable semiconductor materials.

SUMMARY OF THE INVENTION

The object of the invention is to avoid these drawbacks by providing the ability to evaluate the functional behavior of a complex physical system.

This ability is provided by the tool of the instant invention which, according to programmed procedures, automatically produces an abstract specification which defines the functional behavior of a physical system from a concrete description which defines the structure of the physical system. This tool includes means for associating data in the form of objects with the elements of the concrete description, means for associating structural attribute values of these objects with the physical connections of these elements to other elements in the concrete description, means for combining the objects thus obtained into objects which each represent a physical component constituted by the elements of the concrete description associated with the objects regrouped into this object, and means for associating a structural attribute value of this object with each physical connection of an element to an element outside the physical component represented by this object. This tool also includes means for providing this object with a functional attribute whose value is a character string which translates the functional behavior of the physical component associated with this object into formal language, means for automatically re-using the means described above, replacing the regrouped objects with new objects until the regrouping of objects is no longer possible, and means for concatenating the functional attribute values of the resultant objects to produce the abstract specification which defines the functional behavior of the physical system.

Thus, the generation of each new object is accompanied by the addition of a formal language sequence into the text of an initially empty description.

The data, in the form of objects associated with the elements of the concrete description, are stored in a structured way in a physical recording medium which is adapted to their systematic processing by the programmed procedures of a computer without human intervention. In this way, an abstract specification is automatically produced in another physical recording medium which in turn is usable by a computer.

The means for regrouping the objects and associating them with structural attribute values and functional attribute values can be implemented according to various modes.

According to a first mode of implementation of the invention, the tool includes means for associating a datum in object form with each concrete element of this structure, means for associating a structural attribute value of this object with each physical connection of this element to another concrete element of the structure, means for regrouping, with the aid of rules, the objects thus obtained into objects which each represent a physical component constituted by the concrete elements of the structure associated with the objects regrouped into this object, and means for associating, with the aid of these same rules, a structural attribute value of this object with each physical connection of an element to an element outside the physical component represented by this object. The tool also includes means for providing the object, with the aid of these same rules, with a functional attribute whose value is a character string which translates the functional behavior of the physical component represented by this object into formal language, means for automatically activating the means described above until the rules are used up, replacing the regrouped objects with the objects which regroup them, the latter objects being considered as new objects to be regrouped, and means for concatenating the functional attribute values of these remaining objects in order to produce the abstract specification which defines the functional behavior of the physical system.

Thus, the components of the system are progressively constructed in accordance with object recognition rules.

There can also be components which are known by their functional properties in a given technology, from which their structural form systematically results. Here again, to rewrite all of the rules which result in these components quickly becomes tedious and error-producing; moreover, it requires an exhaustive inventory of all the possible components, which is subject to a possible omission when performed by a human being.

That is why, according to another mode of implementation of the invention, the tool includes means for regrouping sets of elementary objects into component objects, with the aid of programmed functions which add to each component object a set of one or more complementary objects constituted by other sets of the component object, this addition being conditional upon a structural layout property which is common to these sets, to the component object and to each complementary object. The tool also includes means for providing the component object with a functional attribute whose value is a function of the complementary object or objects, this function being determined by the common structural layout property.

The mechanisms, which result from the interpretation of the formalism of the production rules by an inference engine, could be implemented by programmed procedures written into the tool. Such an implementation would have the drawback of binding the expression of the rules to a predetermined technology for manufacturing electrical circuits. It would therefore be poorly adapted to the diversity and the progress of these manufacturing technologies.

Also, in order for various users employing different technologies to be able to use this tool in each particular case, it is advantageous to make it parametrizable by a rule file which is outside the programmed procedures.

In accordance with a preferred embodiment the instant invention includes using an object-oriented language to process the data structured into objects wherein, each rule constitutes an object labeled by a name followed by a series of attributes. The visible structures of a rule are the analog equivalents of the internal structures, so they are handled as objects by the programmed procedures.

Thus, for example, a rule known as a production rule is constituted by at least two objects, a conditional part and a part which represents the action. The conditional part itself refers to objects for triggering the action part. The action part then produces objects which are re-usable in the conditional part of other rules.

After being read and interpreted by a programmed procedure, the rules are considered as object data by the programmed procedures of the tool and are handled as such. This provides considerable flexibility in adapting or creating rules which are appropriate to a given technology and is sufficient to allow the attributes of existing objects to be modified or to allow new objects to be created.

On the other hand, the structural elements of the physical system constitute objects which are the analog equivalents of the object data processed by the programmed procedures of the tool. The fact that the objects produced by the rules from given objects could in turn be automatically re-used as given objects in other rules allows them to be processed cumulatively in a hierarchic manner.

According to another aspect of a preferred embodiment of a preferred invention, the structural objects which represent the physical system are selected from the rules by a filtering device which uses error testing mechanisms with backtracking.

For this purpose, these mechanisms essentially include a filter through which a first action, which includes transforming the data in a file which contains the structural description of a manufactured circuit, is executed by means of production rules obtained from a rule file. The rules are triggered by an inference engine. The filter is characterized in that, simultaneously with this first action, it executes a second action which consists of producing a data file which expresses the functional behavior of the transformed data.

According to another aspect of the instant embodiment of the instant invention, the conditional part of a rule includes a model constituted by the combination of objects OBJM whose attribute values are initially free variables, the physical system being constituted by a combination of objects OBJ whose attribute values are constants, and the variables are instantiated at the constants for the attributes of the objects OBJM which are detected by the filtering device as being equivalent to the attributes of the objects OBJ. The values thus obtained are propagated throughout the rule by a mechanism for unifying the variables.

The rules therefore constitute given objects. It is necessary, however, for the human user to write these rules in accordance with the technology being used and the new components being designed. Known elements are used for this purpose. But to rewrite all of the increasingly complex rules which result in the components quickly becomes tedious and error-producing.

In order to alleviate this problem, one advantageous component of the invention is a rule construction tool which automatically generates the model of a known component from the connection list LCO of this component. The tool also automatically generates the formal description of the functional behavior of this component. The human user is thus freed from having to give further thought to the structure of the known component being integrated into his new physical system.

The invention also relates to an industrial process for producing a physical system in which a backward chaining comprises an abstraction phase which, with the aid of a machine, automatically establishes an abstract specification from the resultant product of one of the stages of the direct chain for producing the physical system.

Such a production process includes a phase for transferring a structured set of elements defined by a concrete description DESCONC of this physical system to the material of which the physical system is constituted. It is characterized in that this phase for the transfer to the material is preceded by a first phase which establishes an abstract specification of this physical system and by a second phase which evaluates the abstract specification established, the first phase including associating data in the form of objects with the elements defined by the concrete description, associating structural attribute values of these objects with the physical connections of these elements to other elements defined by the concrete description, regrouping the objects thus obtained into objects which each represent a physical component constituted by elements defined by the concrete description, with which the objects regrouped into this last object are associated, associating a structural attribute value of this last object with each physical connection of each of its elements to an element outside the physical component represented by this last object, providing this last object with a functional attribute whose value is a character string which translates the functional behavior of the physical component associated with this last object into formal language, automatically reiterating the procedure of the first phase described above, handling the objects obtained previously as objects, until the regrouping of objects is no longer possible, finally, concatenating the functional attribute values of the resultant objects, thus producing the abstract specification.

Thus, the abstraction phase is constituted by mechanisms which transform the product of one stage in the direct production chain into an abstract specification transcribed into a formal language, in order to allow its comparison to the initial abstract specification or the creation of a new initial abstract specification. These mechanisms are implemented by means of computer files and a computer program. Such a process has several advantages.

According to a first advantageous feature of the invention, the instant process for producing a physical system wherein, when an initial abstract specification exists, the concrete description is obtained by means of a computer-aided design tool, and the second phase evaluates the abstract specification by means of an evaluation tool which detects whether the abstract specifications are identical, and which authorizes the phase for transferring the structured set of elements defined by the concrete description to the material if it detects that the abstract specifications are identical.

Thus, the result of the abstraction phase, in the form of an abstract specification, is compared to the initial abstract specification in a comparison phase which detects the differences between the two specifications, any difference being interpreted as an error in realization. A modification phase of the direct chain, which is capable of undoing the error in realization, then makes it possible, by means of successive reiterations of the process, to obtain a physical system in conformity with the initial abstract specification.

Generally, the initial abstract specification results from preliminary studies carried out by a human being, based on a specification sheet which establishes what is sought from the physical system to be produced.

However, there may already be a concrete description of an existing physical system which one seeks to improve. A complete repetition of the studies can prove costly.

According to another advantageous feature of the invention, the process for producing a physical system is characterized in that, when a concrete description exists, the second phase evaluates the abstract specification by means of an evaluation tool which makes it possible to modify the abstract specification in order to create an initial abstract specification, a new concrete description is obtained by means of a computer-aided design tool for obtaining a new physical system by transferring the structured set of elements defined by the new concrete description to the material.

DESCRIPTION OF THE DRAWINGS

Other characteristics, details and advantages of the instant invention will be better understood with reference to the following description and in relation to the figures, in which.

DETAILED DESCRIPTION OF THE PREFERRED EMBODIMENTS

Figure 1:
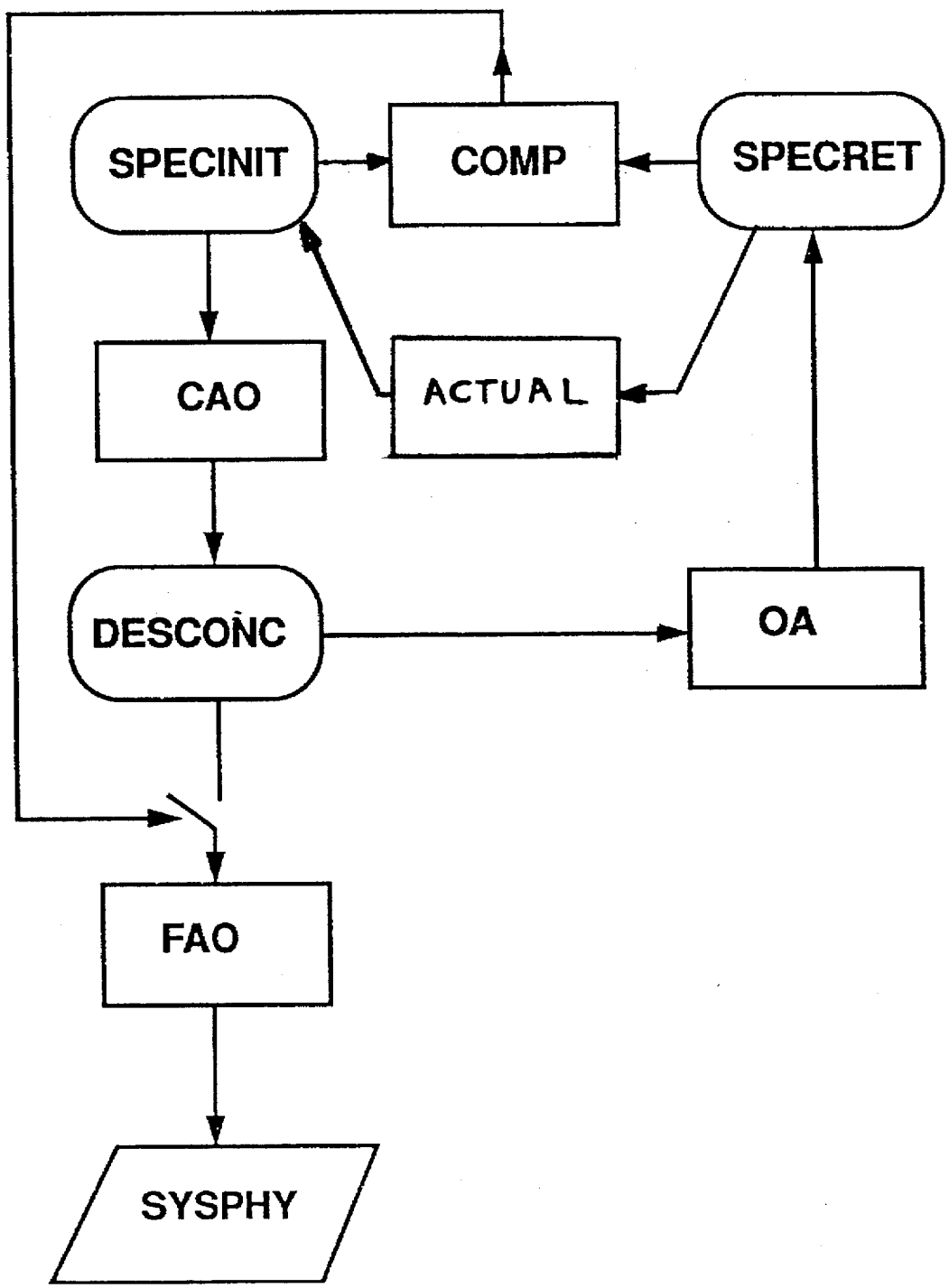
FIG. 1 shows a process for producing a physical system using the invention.

FIG. 1 shows a process for producing a physical system in conformity with the invention. In order to produce a complex physical system SYSPHY such as, for example, an integrated electrical circuit, it is necessary to establish an initial abstract specification SPECINIT of this system. This specification is written in a formal language which allows it to be processed by a device CAD. The device CAD is a known computer-aided design tool of the prior art which makes it possible to establish, from the specification SPECINIT, a concrete description DESCONC of the system SYSPHY. Any adapted CAD device is suitable. A computer-aided manufacturing machine CAM retranscribes the concrete description DESCONC to the material in order to systematically obtain the physical system SYSPHY, whose behavior results from the natural properties of the material of which it is constituted. Any adapted CAM machine is suitable. An abstraction tool OA produces, from the concrete description DESCONC, an abstract specification SPECRET in a formal language which is comparable to the language of the initial abstract specification SPECINIT. An evaluation tool COMP establishes a validation signal VAL which authorizes the transfer of the description DESCONC to the machine CAM if the two specifications SPECINIT and SPECRET are functionally identical. The evaluation tool COMP is, by way of a non-limiting example, a known testing tool which compares the results of the two specifications SPECINIT and SPECRET, or a known formal proof tool which establishes that the canonical formats of the two specifications are identical.

The abstract specification SPECINIT is generally produced during a study phase, from a functional analysis of a specification sheet. However, a firm may have a functional description DESCONC of a physical system which meets certain needs but for which it does not have an abstract specification SPECINIT which allows it to be processed by the computer-aided design tools at its disposal in order to create new physical systems SYSPHY. The firm may wish, for example, to remake the physical system SYSPHY in a new technology or simply to modify the physical system SYSPHY. In this case, an advantageous variant of the realization process includes using the abstraction tool OA to produce an abstract specification SPECRET from the concrete description DESCONC. Then an evaluation tool ACTUAL is used to produce an abstract specification SPECINIT from the abstract specification SPECRET. The evaluation tool ACTUAL is, for example, a text processing tool used in a computer which makes it possible to modify the abstract specification SPECRET in order to adapt it to a new technology or a new specification sheet. The abstract specification SPECINIT thus obtained is then usable as an initial abstract specification to produce a new physical system SYSPHY according to the production process described in the preceding paragraph.

Figure 2:
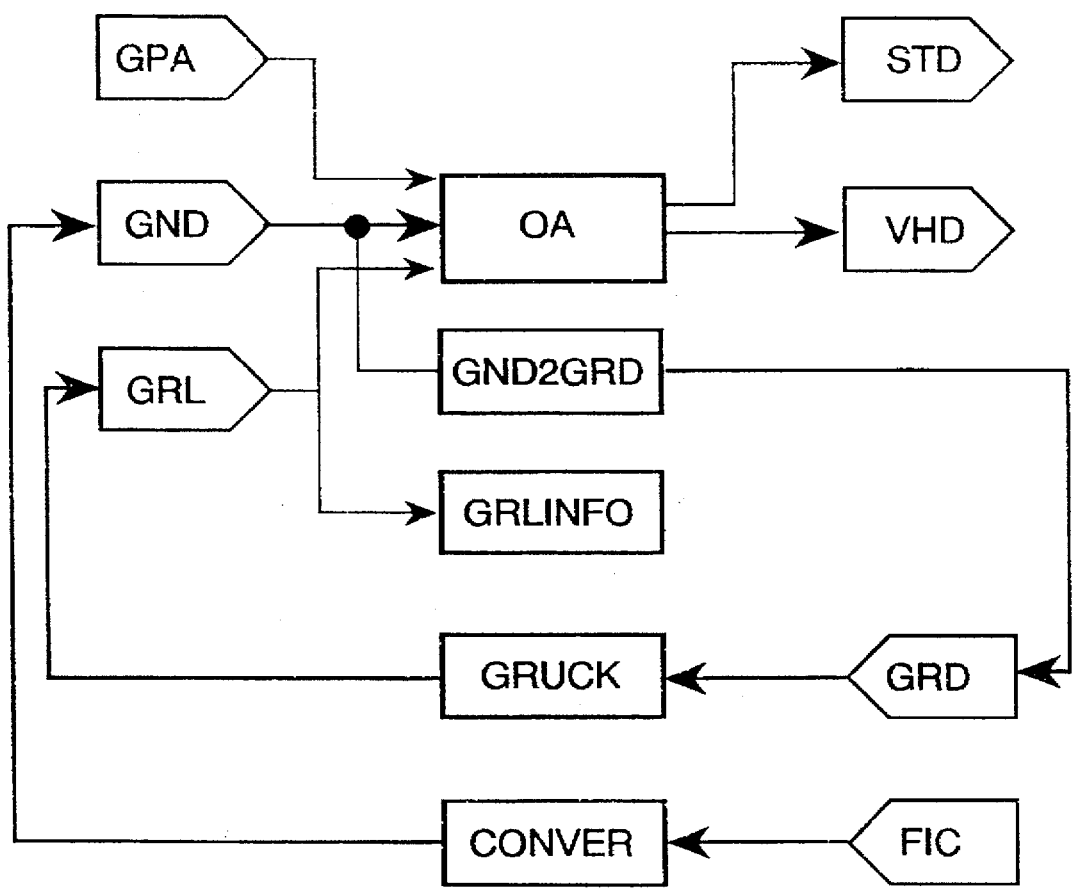
FIG. 2 shows the combination of tools which implement the invention.

FIG. 2 shows five tools: an abstraction tool OA, a tool GRUCK for constructing a rule library GRL, an event recorder for the library GRLINFO, a rule skeleton constructor GND2GRD, and one or more data format converters CONVER.

The function of the abstraction tool OA is to produce an abstraction of the physical system SYSPHY, in order to produce the abstract specification SPECRET. To do this, as will be seen below, it transforms a data file GND from a rule file GRL into a language file VHD. The data file GND contains the description of the physical system SYSPHY. The rule file contains the rules assembled by the tool GRUCK from their textual form GRD, and the formal description language file VHD contains the abstract descriptions produced by the tool OA. After the processing of the file GND by the tool OA, the file VHD contains the abstract specification SPECRET. Moreover, the tool OA makes use of a data file GPA, which contains the formal description language libraries, and a file STD into which the tool OA generates default messages caused by errors related to the data in the file GND or to the rules in the file GRL.

The construction tool GRUCK receives as input one or more files GRD into which rules defined by the user of the tool OA are written. After verification of the writing syntax of these rules, the construction tool GRUCK assembles the correctly written rules into a single library contained in the file GRL. This library is then bound to a given technology.

The event recorder GRLINFO displays information on the libraries constructed by the tool GRUCK such as their version, their author and the date of their creation.

The construction tool GND2GRD transforms the data file GND into a rule file GRD. If there is a connection list LCO of a known component circuit and this connection list LCO describes only this component circuit, this tool uses the abstraction tool OA to produce an abstraction of its structure and to simultaneously produce a formal description of its functional behavior. A list LCO is readable by the concrete description of a component circuit considered as a physical system. The construction tool GND2GRD thus generates a model which could be encapsulated in the conditional part of a rule which results in this component. This allows the user of the tool to rapidly generate rules from known circuits, while avoiding any mistakes. For example, if the user knows that the circuit to be studied includes adders, and if he also has the connection list LCO for each type of adder, the human user can use the construction tool GND2GRD to construct a new rule whose composition is affected by these adders or to simply establish the rule which makes it possible to produce an adder.

A converter CONVER receives as input a file FIC, from which it generates the file GND. The file FIC is a file which contains the concrete description of the physical system obtained from this system. The file FIC therefore may require reformatting before it can be processed by the tool OA.

The file GND contains the concrete description DESCONC in a form which allows it to be processed by the tool OA. The tool OA associates data in object form OBJ with the set of elements in the concrete description. Each object is identified by its ports NC, its internal links NI, the vectors VC of the signals it carries, the components MN, MP . . . which, combined with one another, produce the object. The port NC of an object OBJ1 is a part of the boundary of this object which is shared with another object OBJ2. For example, an electrical circuit is composed of various objects OBJ which exchange signals with one another. If OBJ1 is an emitter and OBJ2 is a transmission line to other objects in the circuit, OBJ1 has a port NC constituted by its output terminal, to which the end of one of the conductors of the transmission line to the object OBJ2 is connected. The internal links NI are the parts of the object which are common to two or more of its components (MN, MP . . . ). In the case of an electrical circuit, the components (MN, MP . . . ) can be NMOS or PMOS transistors, but also, in a non-limiting example, logic gates, counters, and operational amplifiers. The signals VC carried by an object OBJ1 are physical quantities which are present in the ports NC of this object. In the preceding example, this signal could be, in a non-limiting example, a voltage, an electrical current, or even a binary digital value.

Each port NC in the file GND is identified by a sequence number and by the name of a signal or signals VC present in the port NC; each internal link NI is identified by a sequence number, by the name, and possibly by the type of a signal or signals present in the link; each signal vector is identified by the name of the first signal, its first subscript and its last subscript; each component (MN, MP . . . ) is identified by the attributes of the object OBJC which realizes the component. For example, if the object OBJC is a transistor, it will be identified by the eight values of the variables g, d, s, x, y, w, l and c which are, respectively, the numbers of the ports NC connected g to the grid, d to the drain, s to the source, the coordinates x and y of the physical location of the transistor in the circuit, w the width and l the length of the grid, and c the value of the capacity of the grid.

Figure 3:
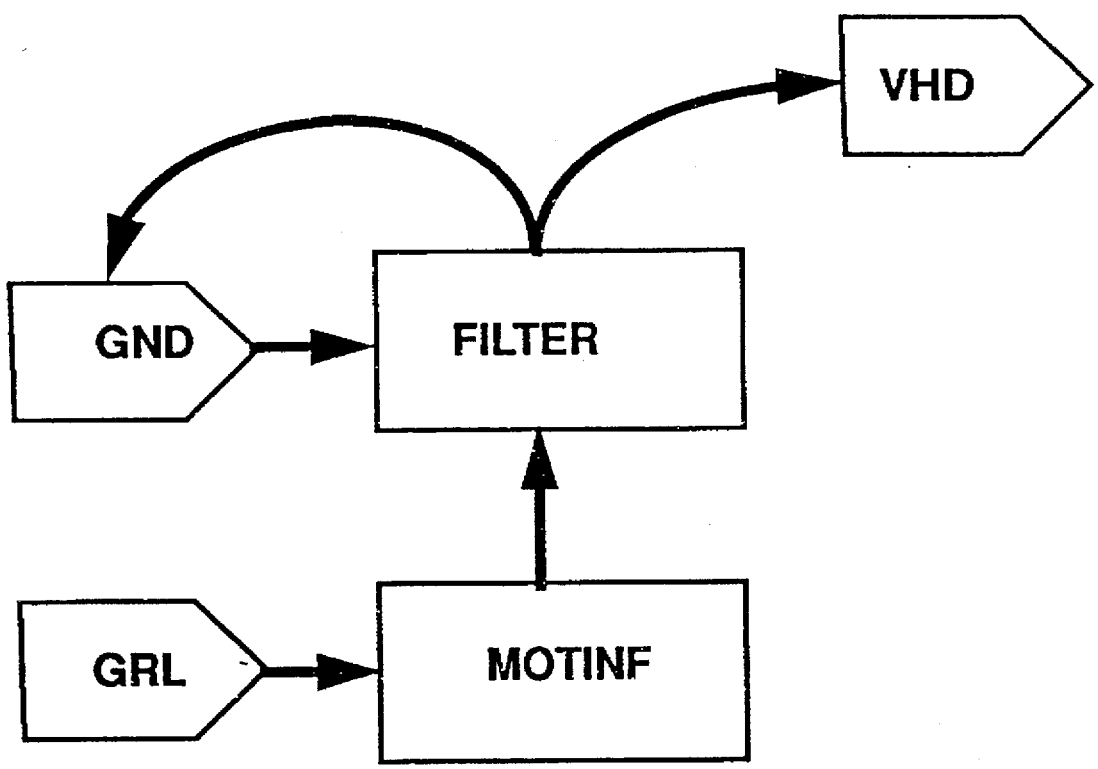
FIG. 3 shows the essential elements of an abstraction tool in conformity with the invention.

As seen in FIG. 3, the abstraction tool OA contains an inference engine MOTINF which successively activates each of the rules contained in the rule file GRL. In order to activate a rule, the inference engine MOTINF selects a rule in the file GRL, then transfers this rule to a filter FILTER. There are two types of selection criteria, ascending and descending. According to the ascending criterion, MOTINF selects, from objects recognized by the rules activated previously, the first rule in which all the objects in the premise are part of the recognized objects. According to the descending criterion, the activation of a rule determines the objects to be recognized in order to satisfy the premise of this rule; this is said to be a object-oriented mode. Each object to be recognized triggers the activation of the rule or rules in which the model of this object appears in the action part of this rule; this is said to be a data-oriented mode. The selection results from the interpretation of an operator by the inference engine MOTINF. This operator is, for example, a pointer marked "→" which contains the head of the storage space of the file GRL in which the selected rule is stored. More precisely, the pointer is differentiated −> in the object-oriented mode and +> in the data-oriented mode. A rule is essentially composed of three elements: an envelope, a conditional block and an action block. The envelope is composed of a name which begins the statement of the rule, and a keyword END which ends the statement of the rule. The name is a character string which makes it possible to identify the rule.

The conditional block is identified by a keyword IF, and it contains the model of a constructed component OBJC to be recognized. The model of a constructed component OBJC is constituted by the combination of elements OBJ. The elements OBJ are combined by means of the operators, AND, OR, NO, OBSERVE, and REDUCE. The operator AND applied to two elements OBJ implies that these two elements result in the combination simultaneously.

The operator OR applied to two elements OBJ implies that at least one of these two elements results in the combination. The operator NO applied to an element OBJ implies that this element does not have to result in the combination. The operator OBSERVE applied to an element OBJ implies that this element is not part of the component OBJC. The operator REDUCE applied to an internal link NI of the object OBJC verifies that no element OBJ other than those combined according to the rule shares this internal link NI and that this link NI is not a port.

The action block is identified by a keyword THEN, and it contains one or more actions to be triggered when a component in conformity with the model is recognized. If several actions are to be triggered, they are separated by a keyword AND. These various actions are indicated by the operators:=, CONSTRUCT, ACTIVE, UPDATE, and ECHO. The operator:= assigns a value to a field of a component OBJC. The operator CONSTRUCT constructs a component OBJC which is recognized in conformity with the model. The only writing restriction at this level is that there must not be more than one action of the CONSTRUCT type in the action part of a given rule. The operator ACTIVE makes it possible to activate certain pre-programmed functions. The operator UPDATE makes it possible to replace the old value of an attribute with a new value. The operator ECHO makes it possible to display a message constituted by a character string.

An object OBJ of the OBJC or OBJE type is distinguished by one or more properties. Each property is associated with a data field by its name. In object terminology, these fields named by an object are more commonly designated by the term attribute. An attribute is the named field of an object which contains one or more values which can be read or written. The value contained in a field is accessed by means of a variable which can be instantiated at this value. The value contained in a field is determined exclusively by the action block of a rule. The structure of an object OBJ, OBJC or OBJE is recognized by a name followed by a key word WITH, followed in turn by one or more operations on the properties of this object.

The conditional and action blocks include two essential types of operations in the data fields of an object OBJ. The first operation, situated in the conditional block, is the unification of a value contained in a field with a variable, and is defined by the operator =. The second operation, situated in the action block, is the assignment of an instantiated variable to a field, and is defined by the operator:=.

The ports NC and the internal links NI are objects OBJE.

One distinctive property of these objects OBJE is that they represent and support the properties attached to the links of the signal type which connect the other objects OBJ, which represent components such as, for example, transistors. An object of the signal type is defined by the keyword SIGNAL followed by a description of a component NC or NI. The description of this component is built around a keyword WITH, which keyword is preceded by a variable which identifies the component and followed by a list of operations in the data fields UTILIZATION, MODE, MARK, TYPE, RESOLUTION, ATTRIBUTE, VISIBILITY, which belong to the object OBJC. The definition of a signal is either labeled in the model of the object NC or NI, or updated in the action block of a rule; it is never explicitly constructed. The data field UTILIZATION is read or updated by a value such as "clock," "lock," "toggle," "switching," "initial load" or "three states"; such a value is used to identify the nature of the signal, but it can also provide information as to its function, for example in the case of a "three states" value; the value is then set by the action block of a rule. The data field MODE makes it possible to read a value such as "emission," "reception" or "duplexed"; such a value is used to identify the flow direction of the signal; it is never updated by the action block of a rule. The data field MARK contains an alphabetical character which describes the state of the signal, and its value is read or updated by the action block of a rule. The field TYPE contains a value such as "binary," "digital," or "analog"; this value defines the type of the signal, and it is read or updated by the action block of a rule. The field RESOLUTION contains a value such as "bus" or "register"; this value defines the functional type of the signal, and it is read and updated by the action block of a rule. The field ATTRIBUTE contains one or more functional values of the signal which allow its formal interpretation by a functional specification language. The field VISIBILITY contains one of the two values "internal" or "external"; these two values make it possible to define whether the signal present in the object OBJC is to be considered the signal of, respectively, a component NI or NV of the object OBJ.

A component object OBJC is formed by one or more elementary objects OBJ. The structure of an object OBJE, like that of an object OBJC, is defined by the keyword WITH preceded by the name of the model to which the object OBJE refers and followed by a sequence of operations in the data fields of this object OBJE. For such an object, these operations are essentially reduced to the updating of these fields by the identification values of the objects NC or NI to which it is connected. For example, it is known that an MOS transistor is characterized by a grid, a drain, a source, the width and length of its grid, and if it is integrated into a circuit, the coordinates of its position in this circuit.

If the object OBJE is an NMOS transistor, its name is then "n_mos" and its properties are defined with the aid of seven fields g, d, s, x, y, w, and l, in which g contains the name G of the grid signal, d contains the name D1 of the drain signal, s contains the name S1 of the source signal, x contains the abscissa N1 and y the ordinate N2 of the transistor, w contains the width W1 and l the length L1 of the grid. This object OBJE is therefore described in the following way:

n_mos WITH g=G; d=D1; s=S1; x=N1; y=N2; w=W1; l=L1.

A complete circuit is itself an object OBJC, defined by the keyword WITH preceded by a name and followed by operations in its data fields INPUT, CONTROL, INTERNAL, OUTPUT, TEXT, DELAY, OTHER. The field INPUT contains the input signals of the circuit, the field CONTROL contains the list of the control signals of the circuit, the field INTERNAL contains the internal signals of the circuit, the field OUTPUT contains the list of the output signals of the circuit, the field TEXT contains a formal description of the behavior of the circuit, the field DELAY contains the time values of the circuit, and the field OTHER contains the other attributes of the object OBJ which it may still be desirable to identify.

The description of the behavior of the circuit contained in the field TEXT is constituted by fixed lower case character strings, between which the uppercase character strings which represent variables are inserted. These variables are instantiated with the name of the signals during the editing which follows the abstraction process. The set of descriptions is concatenated in the file VHD. The syntax of the description is, in a non-limiting example, the syntax of the known language VHDL. In this language, the processing of the signals y is explicitly described. The signals are interpreted in the form of a data flow which enters and exits from elementary units, each of which has a specific behavior which results in the global behavior of the system. The complete description of a unit in VHDL language is essentially usable by known simulation tools, formal proof tools or abstraction tools. The interfaces of each unit with the other units in the circuit are constituted by input-output ports with which the attribute declarations of the signals passing through them are associated. Each signal is defined by a name, a mode and a type which appear in the declarative part of the statement of the unit. The name is the identifier of the signal as defined by the designer of the circuit. The mode indicates the direction of the data flow associated with the signal through the port in question: input, output, or duplex. The type indicates the nature of the signal, such as binary, digital, analog, under voltage or under current, etc. The architecture of each unit defines the model of a data flow inside the unit. Each signal is defined by a name and a type.

The filter FILTER operates in the following way. Each time it receives a new rule from the inference engine MOTINF, the filter FILTER compares the data set, which represents the objects OBJE contained in the file GND, to the model of an object OBJC encapsulated in the conditional block of the rule. The filter FILTER selects the objects OBJE which completely satisfy the conditional part of the rule. To do this, the filter FILTER refers to the name of the class to which each object OBJE belongs and to one or more attributes of this object OBJE. The names of the attributes are defined at the level of the class. The reference to the name of an attribute makes it possible to access the value which describes the object OBJE for this attribute. Each value makes it possible to instantiate one or more free variables of the model.

Each time a complete set of objects OBJE is selected which satisfies the conditional part of the rule, the action part of this rule is triggered. The action part of the rule includes two essential actions. The first action is a classification action which consists of producing a new object OBJC, which is an instance of the class of the model whose structural attributes result from a combination of the structural attributes of the selected objects OBJE. The second action consists of replacing, in the internal representation of the data which is initially constructed by the programmed procedure from the file GND, the set of objects OBJE then selected with the only object OBJC. In the final phase, the set of behavioral descriptions of the objects OBJE which are present in the internal representation of the data is edited.

Figure 4:
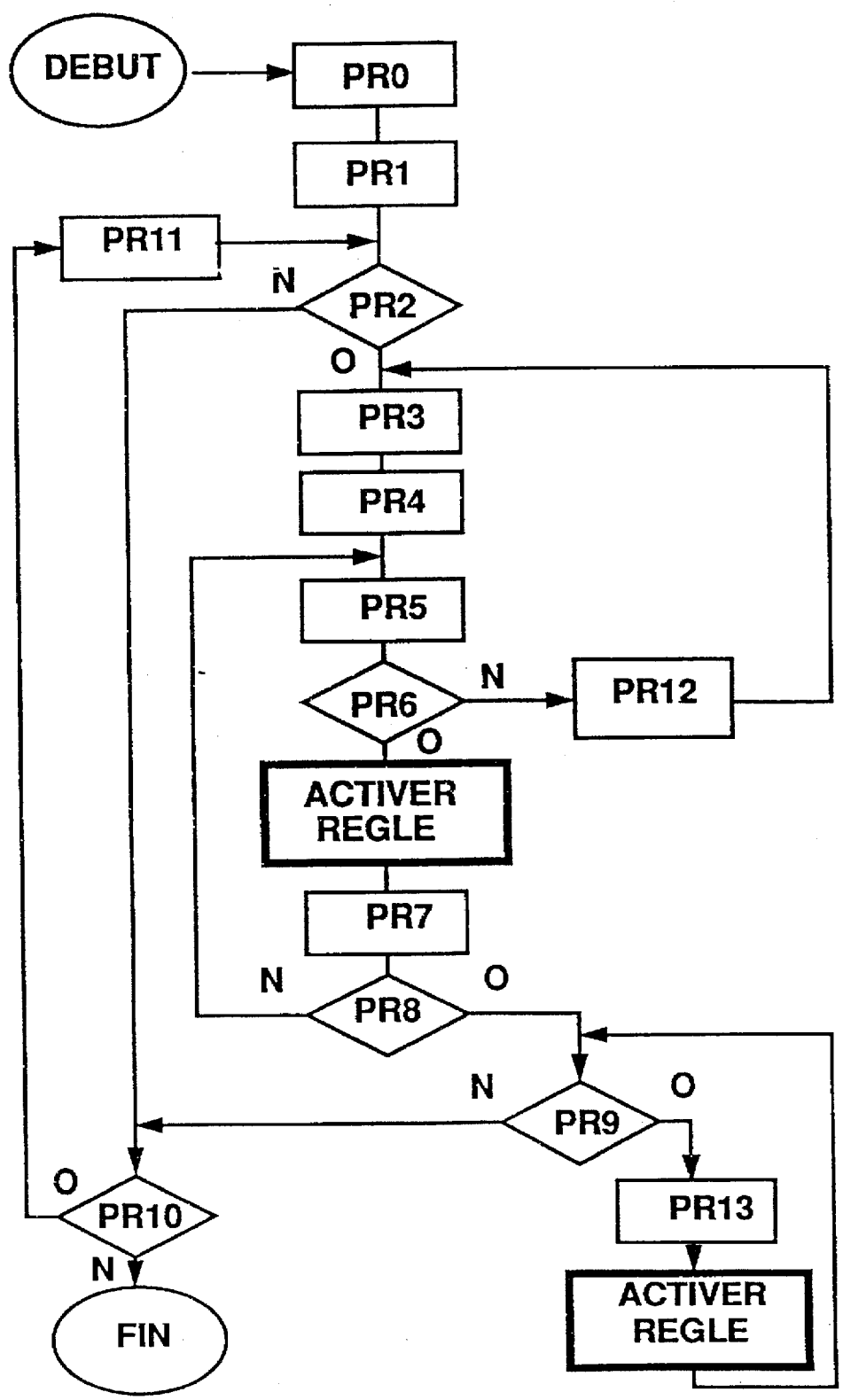
FIG. 4 shows the flow chart of an inference algorithm according to the invention.

FIG. 4 shows the rule selection procedure whose entry point is designated BEGIN and whose exit point is designated END. The object of this procedure is to successively select each of the rules of the library GRL and to call another procedure ACTIVATE$_{13}$ RULE, described in reference to FIG. 5, for each of the rules R selected.

Figure 5:
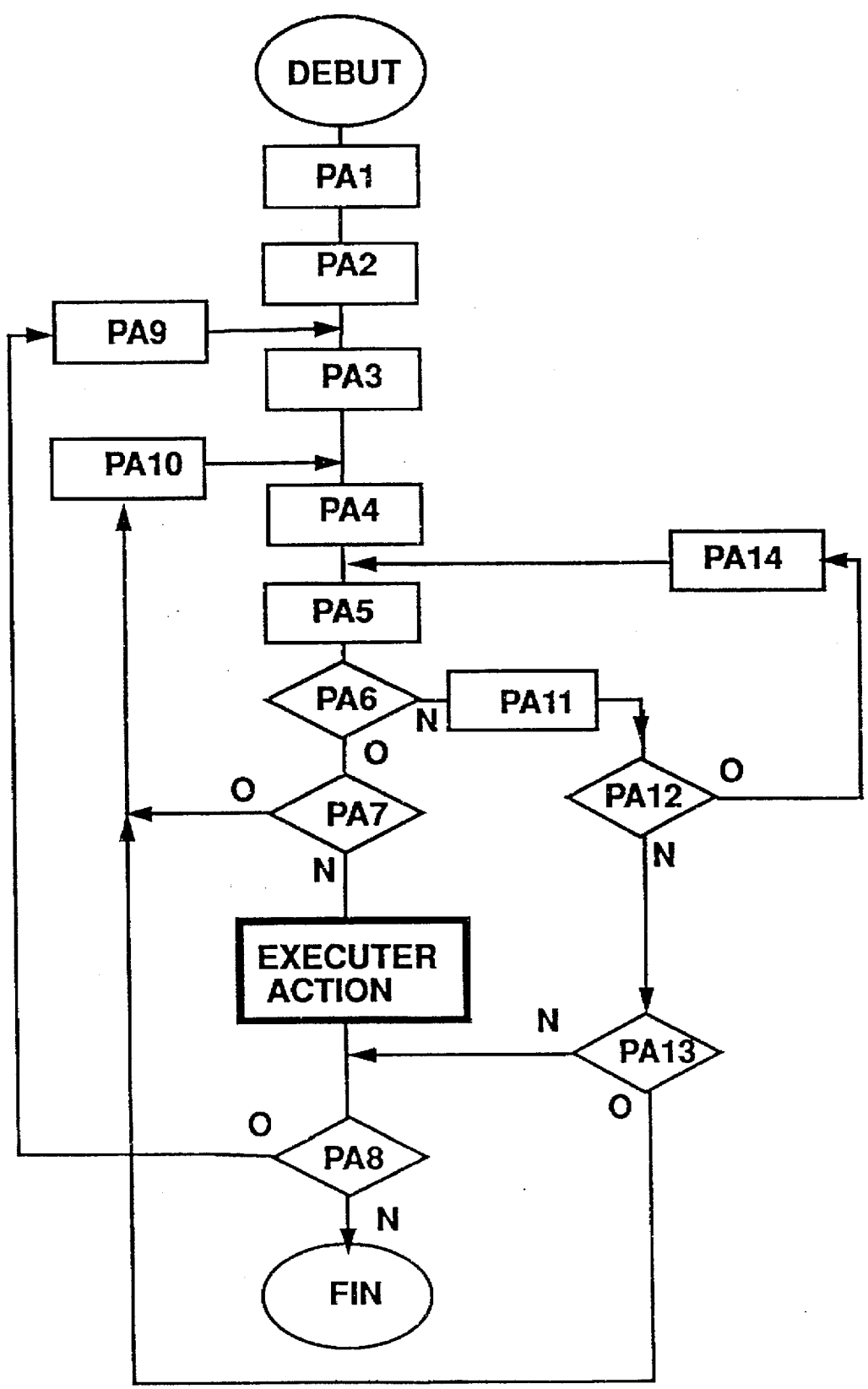
FIG. 5 shows the flow chart of a filtering algorithm according to the invention.

As shown in FIG. 5, the procedure ACTIVATE_RULE has an entry point designated BEGIN and an exit point designated END. This procedure uses the filtering mechanisms which regroup the objects OBJE in the connection list into objects OBJC, and triggers the phase EXECUTE_ACTION, in which the action part of the selected rule R associates a structural attribute value with the object OBJC. The structural attribute value represents the physical connection of this object to the objects outside it. Moreover, it provides the object OBJC with a functional attribute whose value is a character string which translates the functional behavior of the physical component associated with the object OBJC into formal language.

The conditional part of a rule R contains a model M of the object OBJC. This model M is constituted by a logical combination of expressions E. All the data in the connection list (netlist), are scanned, and the only data retained are those which satisfy the logical combination of expressions E1.

The object of the first phase PA1 is to limit the application of the model to just the limited data spaces which are capable of satisfying it and thereby to optimize the filtering process used. A datum is constituted by the association of one or more values. The data are contained in lists. The data lists LD are organized so that the datum DS subsequent to a known datum D in the list LD can always be accessed. Each datum is assigned a field MAR1 whose value is zero as long as this datum is not used. This limitation avoids the execution of useless searches for objects OBJC where they have no reason to appear. For this reason, the phase PA1 constructs a list LVPA of the software hook values VPA. A software hook value is a value which must necessarily have an attribute which is characteristic of the object OBJC. The subassemblies of the values in the list LVPA will be used to furnish initial values to the model M, which will limit the space of the search for data which satisfy the model.

In the phase PA2, a function INITIAL sets the variables of the model to a free variable state. The function INITIAL initializes a stack MEMOV with the contents of the variables which have been set in this way. The stack MEMOV is intended to preserve the successive states of the variables of the model in the course of a procedure. The first value VPA in the list LVPA is then propagated in the model M. That is, the variables of the model which correspond to the software hooks with the value VPA, are instantiated at these values.

In the phase PA3, the first expression E of the model M is selected. Each expression E of the model is associated with a pointer PSDC at the current datum D which will be presented to E. This pointer contains the address of the current datum before it is compared to the model.

The phase PA4 makes use of the current expression E derived from PA3 or PA10. A first datum D1, whose type corresponds to that of E and whose field MAR1 has a value of zero, is selected from the expression E.

In the phase PA5, the value of the field MAR1 of the current datum D furnished by PA4 or PA14 is set at 1. The current datum D is recorded in the pointer PSDC associated with the expression E. The function MEMORIZE is executed. The function MEMORIZE preserves the state of the variables in the model at the moment the phase PA5 is activated. This state is preserved at the top of the stack MEMOV.

In the phase PA6, the current datum D indicated by PSDC is compared to the current expression E using the filter FILTER. The comparison mechanism of the filter FILTER consists of instantiating the variables of the expression E by means of the values of the current datum D, unless they would contradict the values of the previously instantiated variables in the expression E. The current datum D then satisfies the expression E, which triggers the phase PA7. If the datum D does not satisfy the expression E, the phase PA11 is triggered. In the phase PA7, a test is conducted for the existence of a logical conjunction of the satisfied expression E with a subsequent expression SE of the rule R. The existence of an expression SE makes it necessary to verify that it can be satisfied, which triggers the phase PA10. If no expression SE exists, the phase EXECUTE_ACTION is triggered.

In the phase EXECUTE_ACTION, the values contained in the variables of the model are propagated in the action part of the rule R. The instructions of the action part are executed. The end of the execution of the action part of the rule triggers the phase PA8.

The phase PA8 tests whether other data VPA in the list LVPA are available as a result of the data already tested. The existence of such data triggers the phase PA9. The end of the list LVPA terminates the procedure, and is indicated by END.

In the phase PA9, the function INITIAL sets the variables of the model at a free variable state. The function INITIAL initializes the stack MEMOV with the contents of the variables set in this way. The stack MEMOV is intended to preserve the successive states of the variables of the model in the course of the procedure. The first value VPA in the list LVPA is then propagated in the model M. That is, the variables of the model which correspond to the software hooks with the value VPA are instantiated at these values. The procedure is reiterated as before beginning with the phase PA3.

In the phase PA10, the subsequent expression ES determined by the phase PA7 or PA13 is considered as a new current expression E in the phase PA4 triggered as a result of the phase PA10.

The phase PA 11 is triggered by the step PA6 in the case in which the current datum D does not satisfy the expression E. The value zero is then assigned to the mark MAR1 of the datum D, in order indicate that this datum is again available. The function RESET is activated. This function resets the variables to the last state memorized at the top of the stack MEMOV, that is, before their instantiation by the values of the datum D. This phase is followed by the phase PA12.

In the phase PA12, the list LVPA is scanned in order to detect the presence of available data VPA in this list which can satisfy the expression E. The existence of such data triggers the phase PA14. The opposite case triggers the phase PA13.

In the phase PA13, a test is conducted for the existence of a logical disjunction of the unsatisfied expression E with a subsequent expression ES of the rule R. The existence of an expression ES makes it necessary to verify that it can be satisfied, which triggers the phase PA10. If no expression ES exists, the phase PA8 is triggered.

In the phase PA14, the datum VPA, detected in the phase PA12, becomes the new current datum D. That is, its address is stored in the pointer PSDC. The value 1 is assigned to the mark MAR1 of this datum. The preceding procedure is then reiterated beginning with the phase PA5.

The END of this procedure causes a return to the call procedure described in reference to FIG. 4.

In the phase PR0, two lists of rules LR− and LR+ are constructed. Each rule R in the list LR− and in the list LR+ is assigned, respectively, to a field MAR− and a field MAR+, at values which are initially zero.

In the phase PR1, a pointer PSEQUENCE is branched onto the first rule R of the list LR−.

In the phase PR2, the value of the field MAR− of the rule R indicated by PSEQUENCE is tested. A zero value triggers the phase PR3. A value other than zero triggers the phase PR10.

In the phase PR3, the value of the field MAR− is set at 1, in order to indicate the choice of the rule R and to avoid unnecessarily activating it a second time.

In the phase PR4, the rule R is stored at the top of a stack PILR. The role of this stack is to put the rules which have been selected by MOTINF, but which do not have all the necessary elements to be activated and therefore cannot be activated, in a wait state. In effect, the model of a rule refers to composed objects OBJC, which are themselves composed of other objects OBJC or of an object OBJE. Therefore, a rule designated by R1, for example, could refer in its model part to an object OBJC which could itself be constructed by another rule R2 not yet activated at this instant. It would then be necessary to put the rule R1 in a wait state in the stack PILR, then to seek to activate the rule R2, and finally to return to the rule R1 by scanning the stack according to a "last-in-first-out" mode. Thanks to the stack PILR, this process will be iterated for any number of rules. This is carried out in the phases PR4, PR5, PR7, PR8 which will now be described.

In the phase PR5, the rule R of the top of the stack PILR is loaded into the working register.

In the phase PR6, a test is conducted to determine whether or not the rule R can be activated. A positive response triggers the phase ACTIVATE_RULE, and a negative response triggers the phase PR12. The rule R can be activated if each object class OBJC which appears in the model M of the rule R is identifiable to an object class OBJC contained in a list SEARCH. The list SEARCH contains all the object classes OBJC constructed by the previous activation of a rule. The test in the phase PR6 is conducted in the following way. Each object class OBJE of the model M is compared to the contents of the list SEARCH. When an object class OBJE is not listed in the list SEARCH, this class constitutes a class of objects to be constructed OX, which triggers the phase PR12. If no object class OX is detected, the rule R can be activated. At the return to the procedure triggered by the phase ACTIVATE_RULE described above, the phase PR7 is triggered.

In the phase PR7, the rule R which has just been activated is deleted from the stack PILR. The name of the class of the object OBJC, which has just been constructed by the action part of the rule, is added to the contents of the list SEARCH. The objects OBJC in the list SEARCH will thus be usable by other rules.

The phase PR8 is a test of the contents of the stack PILR. If the stack PILR is not empty, the procedure is reiterated beginning with the phase PR5. If the stack PILR is empty, the phase PR9 is triggered.

The phase PR9 is a test of the contents of the list LR+. The detection in the list LR+ of a rule R whose value contained in the field MAR+ is zero triggers the phase PR13. The absence of a field MAR+ which contains a zero value triggers the phase PR10 The phase PR9 consists of testing whether there is any rule in LR+ which is not marked with the value 1 in MAR+, so that all the objects OBJC labeled in its model M will necessarily be included in the list SEARCH.

The phase PR13 consists of accessing such a rule and marking its field MAR+ with the value 1. The rule is then activated by ACTIVATE_RULE and the procedure is iterated beginning with PR9.

The phase PR10 is a test of the contents of the list LR−. The existence of a subsequent rule R in the list LR−, with a zero value in the field MAR−, triggers the phase PR11. The absence of such a rule R terminates the procedure with END.

In the phase PR11, the address of the rule R detected in the phase PR10 is stored in the pointer PSEQUENCE which thus determines a new choice of a rule R for a continuation of the procedure beginning with the phase PR2.

The phase PR12 searches for the rule RX to be activated in order to construct the objects of the type OX detected in the phase PR6. Once found, the rule RX is considered a chosen rule R and the procedure is reiterated beginning with the phase PR3.

The cycle PR3, PR4, PR5, PR6, PR12 just described is reiterated as many times as necessary in order to end with a rule in LR− which can be activated in PR6.

The procedures just described are well adapted to the recognition of predefined circuits by means of the application of rules whose conditional block encapsulates a model of the desired circuit. Other procedures are possible without going outside the scope of the present invention. Appendices 1 through 7 provide a non-limiting example of the use of a predefined function for recognizing dual circuits.

Figure 6:
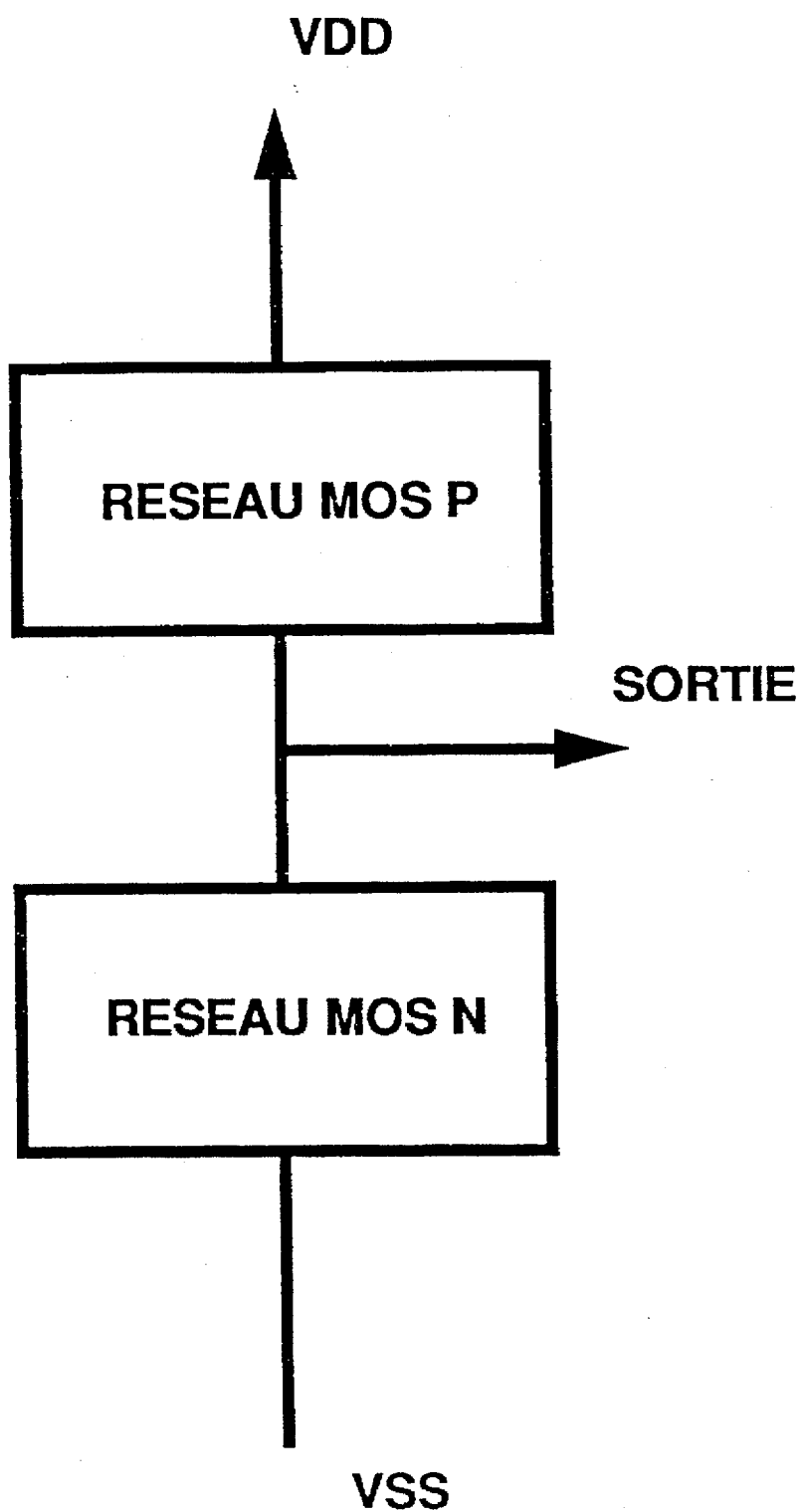
FIG. 6 shows a simple example of a physical system to which the invention has been applied.

FIG. 6 shows a dual CMOS circuit, formed by two networks of transistors, an NMOS network connected to a voltage VSS and a PMOS network connected to a voltage VDD, which are functionally complementary and are connected to the same output E. The electrical behavior of dual networks is such that, in any configuration of the control signals, one and only one of the two networks is running.

Figure 7:
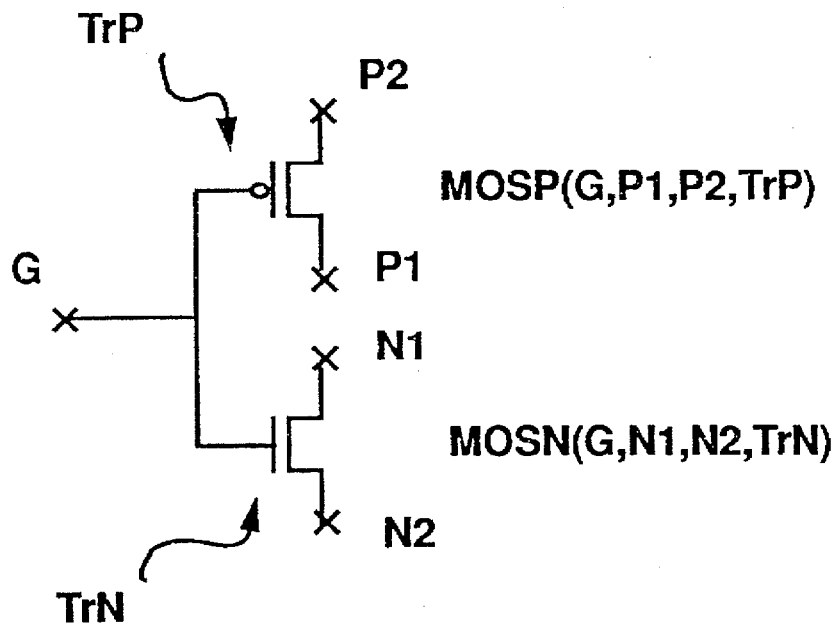
FIGS. 7 through 11 show examples of components which can form the object of programmed procedures, Appendices 1 through 7 present an example of programmed procedures adapted to provide the components shown in FIGS. 7 through 11.
Figure 8:
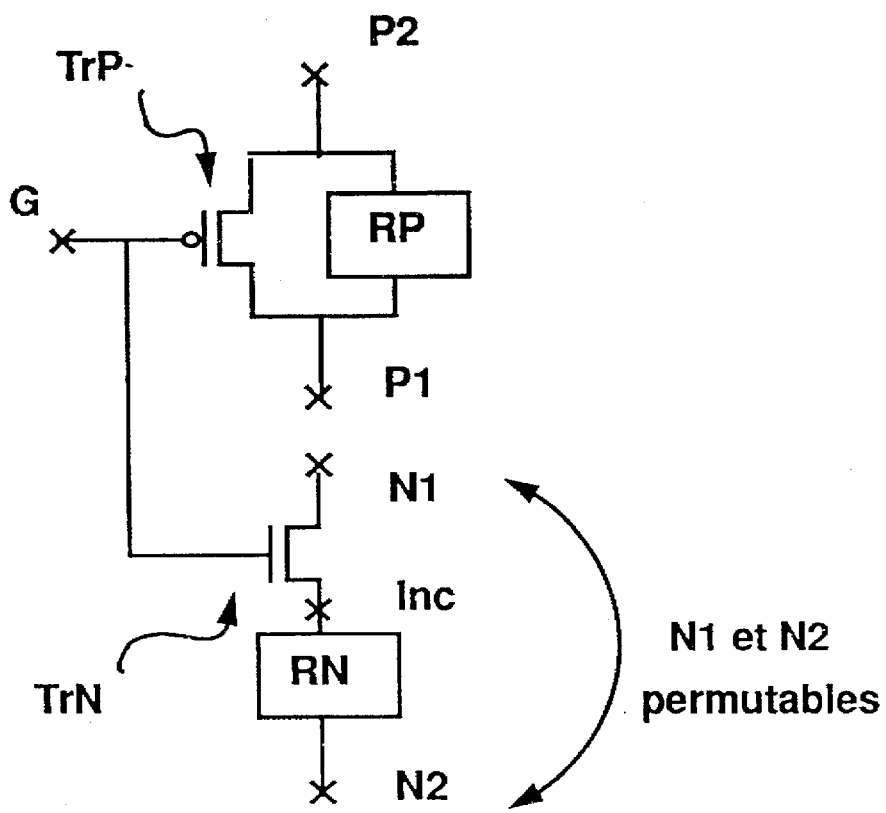
Figure 9:
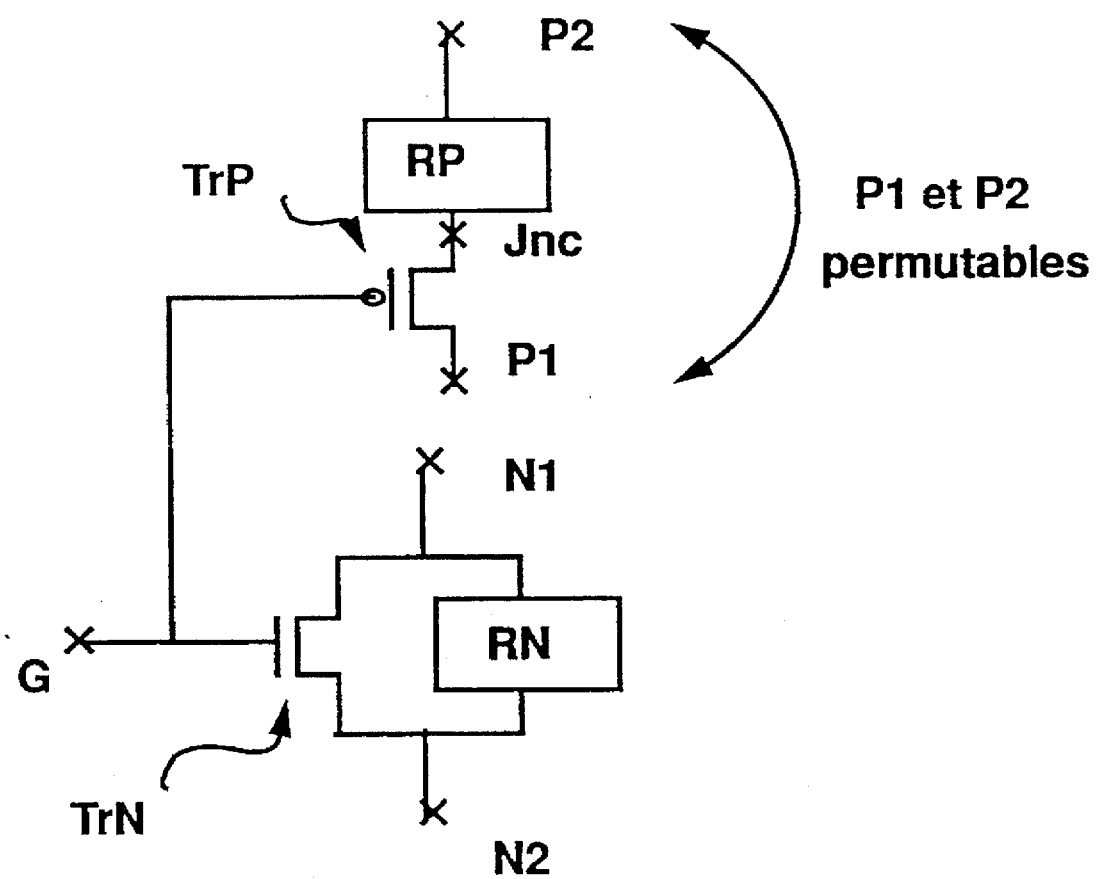
Figure 10:
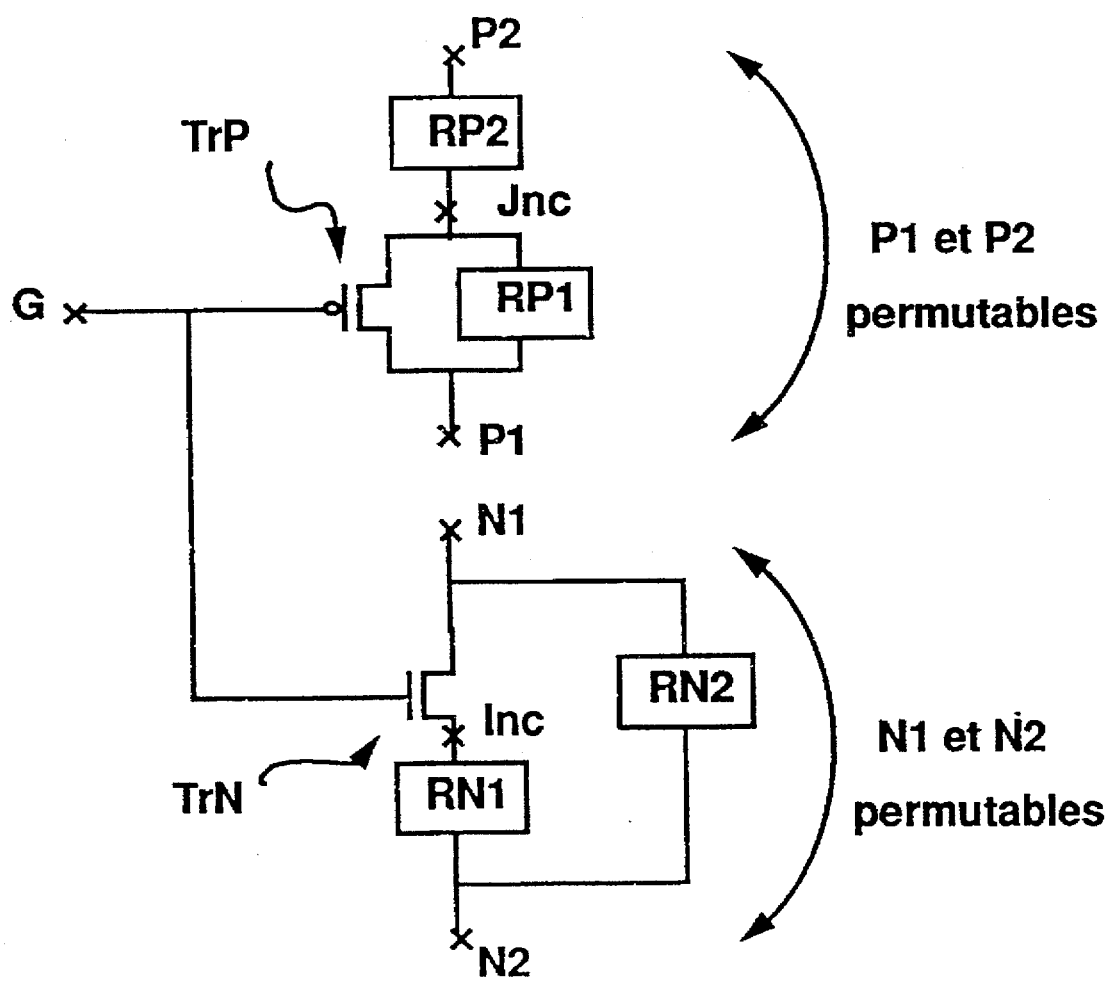
Figure 11:
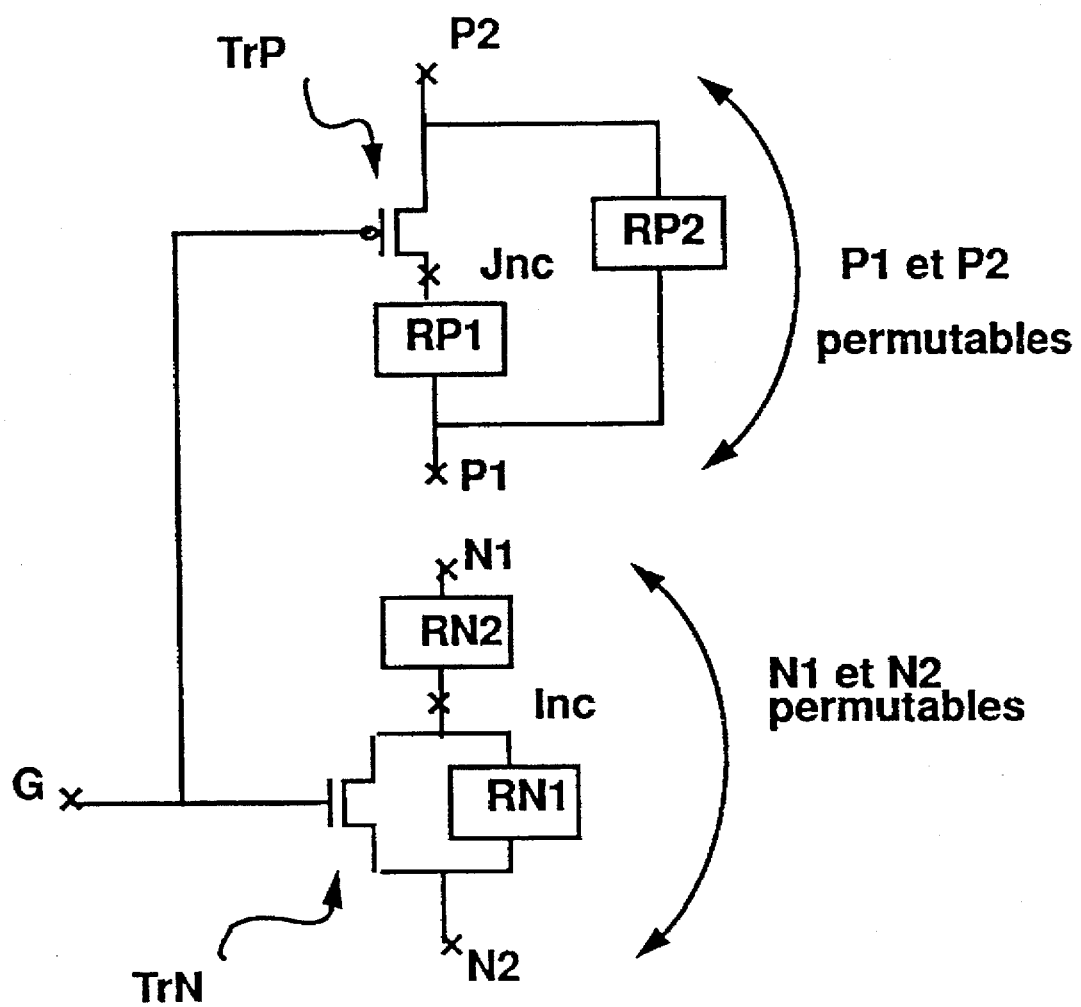

FIG. 7 shows a simple example of dual circuits constituted by, respectively, a PMOS transistor and an NMOS transistor controlled by the same grid signal at G. The source and the drain of the PMOS transistor are connected to other elements at the circuit in P1 and P2. The source and the drain of the NMOS transistor are connected to other elements of the circuit at N1 and N2. Only one of these two transistors is running at a time. For more complex circuits, the two dual networks are structurally configured so that two elements disposed in series in one of the networks corresponds to a parallel symmetrical disposition in the other network. FIG. 8 illustrates this property by showing an assembly of two transistors, TrP of the PMOS type and TrN of the NMOS type which share, as in FIG. 7, the same grid connection G; the transistors TrP and TrN, respectively, are also connected in parallel to a network RP and in series to a network RN. This assembly constitutes a pair of dual networks if and only if the networks RP and RN themselves constitute a pair of dual networks. Other possible configurations of dual networks are shown in FIGS. 9 through 11. In FIG. 9, the network RP is in series with the transistor TrP, and the network RN is in parallel with the transistor TrN. FIG. 10 shows a combination of the case in FIG. 9 added to that in FIG. 8 with, respectively, RP equivalent to RP2 and RP equivalent to RP1 FIG. 11 shows a combination of the case in FIG. 8 added to that in FIG. 9 with, respectively, RP equivalent to RP2 and RP equivalent to RP1.

The circuits in FIGS. 7 through 11 have a particular advantage when P2 is connected to a voltage Vdd which expresses the logic value "1," N2 is connected to a voltage Vss which expresses the logic value "0," and P1 and N1 are connected to a common output.

In the first case, FIG. 7, an Output signal is determined by the equation Q:

Output=not G.

In the second case, FIG. 8, if Q(RP) is the equation which results from the network RP:

Output=not G or Q(RP).

In the third case, FIG. 9, with the same convention:

Output=not G and Q(RP).

In the fourth case, FIG. 10, if Q(RP1) and Q(RP2) are the equations which result, respectively, from the circuits RP1 and RP2:

Output=(not G or Q(RP1)) and Q(RP2):

In the fifth case, FIG. 11, with the same convention:

Output=(not G and Q(RP1)) or Q(RP2).

The automatic recognition of the circuits involved in one of the cases in FIGS. 7 through 11 and the automatic generation of the formal description of their functionalities are realized by means of a computer, using the recursive procedures in Appendices 1 through 7.

In Appendix 1, the search procedure for the outputs which result from dual networks is essentially constituted by two phases Ph100 and Ph101. The phase Ph100 scans all of the output signals NP of the circuit studied. The phase Ph101 is reiterated for each output signal NP. Phase Ph101 poses a question in order to know whether the signal NP results from the output of a circuit CMOS CUAL(G,P1,P2,N1,N2,Q), with G being the variable which represents a grid signal common to two transistors TrP and TrN, P1 instantiated at the output value, P2 instantiated at the value vss, N1 instantiated at the output value, N2 instantiated at the value vdd, and Q as the functional equation associated with such a dual network. The phase Ph101 then calls the procedure CMOS CUAL defined in Appendix 2.

In Appendix 2, the procedure CMOS CUAL is essentially constituted by a succession of phases Ph201 for recognizing a circuit of the type in FIG. 7, Ph202 for recognizing a circuit of the type in FIG. 8, Ph203 for recognizing a circuit of the type in FIG. 9, Ph204 for recognizing a circuit of the type in FIG. 10, Ph205 for recognizing a circuit of the type in FIG. 11, and Ph206 which concludes with a failure to recognize a dual circuit for the values which instantiate the variables for calling the function. In the phases Ph201, Ph202, Ph203, Ph204 and Ph205, the recognition of the circuit is achieved by calling, respectively, the functions DUAL1, DUAL2, DUAL3, DUAL4 and DUAL5 with their variables unified with those of the calling procedure. Until there is a successful call which returns the value true, the calls of functions DUAL2 through DUAL5 are executed with all the permutations of the nodes N1, N2 or P1, P2 made possible by the behavioral symmetry of the drain and the source of a CMOS transistor. Thus, nothing changes if the network RN in FIG. 8 is physically situated upstream from the transistor TrN, or if the network RP in FIG. 9 is physically situated downstream from the transistor TrP. This comment remains valid for the networks RN1 and RP2 in FIG. 10 or the networks RN2 and RP1 in FIG. 11.

In Appendix 3, the procedure DUAL1 is theoretically called with the free variable G, since the object of this procedure is to identify a couple of transistors TrP and TrN whose grid is connected to a common node G, in conformity with the structure shown in FIG. 7. The variables P1, P2, N1, N2 which are still free will be instantiated in case of a success in Ph302. In Ph301, all the couples of MOS transistors TrN and TrP available in the electrical circuit whose grids are connected to the same node G are scanned. A couple of transistors (TrN, TrP) is available when it has not been marked by a previous choice in another procedure. For each of these couples of transistors, Ph302 tests whether the source and the drain of the transistor TrN are connected at N1 and N2, and whether the source and the drain of the transistor TrP are connected at P1 and P2. If the two conditions are verified, then in Ph303, the value true is returned to the calling procedure, the variable Equation is instantiated with the signal at G, and the variables P1, P2, N1, N2 are instantiated in fact. If not, in Ph304 the transistors TrN and TrP are left available for possible further tests, and the variables are reset to their state memorized in Ph300 in order to backtrack to the test conducted in Ph302 or to return the variables to their initial state in case of a failure in Ph305.

The procedures DUAL2 through DUAL5 are based on the same principle as the procedure DUAL1.

As seen in Appendix 4, the procedure DUAL2 is essentially distinguished in Ph402, which tests in a different way whether the drain and the source of the transistor TrN are connected at N1 and to the node Inc in a network RN. This case corresponds to that in FIG. 8. In this case, it is necessary that the network RN be the dual of a network RP connected at P1 and P2. This condition translates into a recursive call of the function CMOS CUAL, in which the variable N1 is instantiated at the value of the node Inc. In Ph403, the variable Equation is instantiated at the disjunction of the signal at G and the equation Q returned by the recursive call of CMOS CUAL which satisfies the conditions in Ph402.

As seen in Appendix 5, the procedure DUAL3 is essentially distinguished in Ph502, which tests in a different way whether the drain and the source of the transistor TrP are connected at P1 and to the node Jnc of a network RP. This case corresponds to that in FIG. 9. In this case, it is necessary that the network RP be the dual of a network RN connected at N1 and N2. This condition translates into a recursive call of the function CMOS CUAL, in which the variable P2 is instantiated at the value of the node Jnc. In Ph503, the variable Equation is instantiated at the conjunction of the signal at G and the equation Q returned by the recursive call of CMOS CUAL which satisfies the conditions in Ph502.

As seen in Appendix 6, the procedure DUAL4 is essentially distinguished in Ph602, which tests in a different way whether the source and the drain of the transistor TrN are connected at N1 and to the node Inc of a network RN1, and whether the drain and the source of the transistor TrP are connected at P1 and to the node Jnc of a network RP2. This case corresponds to that in FIG. 10. In this case, it is necessary that the network RN1 be the dual of a network RP1 connected at P1 and to the node Jnc. This condition translates into a recursive call of the function CMOS CUAL, in which the variable P2 is instantiated at the value of the node Jnc and N1 is instantiated at the value of the node Inc. In this case, it is also necessary that RP2 be the dual of a network RN2 connected at N1 and N2. This condition translates into a recursive call of the function CMOS CUAL, in which the variable P1 is instantiated at the value of the node Jnc. In Ph603, the variable Equation is instantiated at the conjunction of the equation Q2 and the disjunction of the signal at G and the equation Q1, in which Q1 and Q2 are the equations returned by the recursive calls of CMOS CUAL which satisfy the conditions in Ph602.

As seen in Appendix 7, the procedure DUAL5 is essentially distinguished in Ph702, which tests in a different way whether the drain and the source of the transistor TrN are connected at N1 and to the node Inc of a network RN2, and whether the drain and the source of the transistor TrP are connected in P1 and to the node Jnc of a network RP1. This case corresponds to that in FIG. 11. In this case, it is necessary that the network RN2 be the dual of a network RP2 connected at P2 and P1. This condition translates into a recursive call of the function CMOS CUAL, in which the variable N2 is instantiated at the value of the node Inc. In this case, it is also necessary that RP1 be the dual of a network RN1 connected to the node Inc and at N2. This condition translates into a recursive call of the function CMOS CUAL, in which the variable P2 is instantiated at the value of the node Jnc and N1 is instantiated at the value of the node Inc. In Ph703, the variable Equation is instantiated at the disjunction of the equation Q2 and the conjunction of the signal at G and the equation Q1, in which Q1 and Q2 are the equations returned by the recursive calls of CMOS CUAL which satisfy the conditions in Ph702.

Thus, the procedures just described associate a datum in the form of an object TrN or TrP with each MOS transistor in the circuit, assign the structural attribute values N1, N2, P1, P2 of these objects OBJE to each physical connection of a transistor TrN and a transistor TrP to another concrete element of the circuit, and regroup the objects OBJE thus obtained into objects OBJC in the phases Ph302, Ph402, Ph502, Ph602, and Ph702. Each object OBJC represents a dual circuit constituted by the concrete elements of the circuit which are associated with the objects OBJE regrouped in the object OBJC. The search procedure associates a structural attribute value Output, Vss, Vdd of the object OBJC with each physical connection of an element TrN, TrP to an element outside the dual circuit represented by the object OBJC. In phase Ph101, the search procedure also provides the object OBJC with a functional attribute EQUATION, whose value is a character string which translates the functional behavior of the dual circuit associated with the object OBJC into formal language. This character string is automatically generated in the form of logical equations Q in the phases Ph101, Ph303, Ph403, Ph503, Ph603, Ph703.

The invention has just been described in its application to a particular physical system constituted by an electrical circuit of CMOS transistors. Other applications are possible without going outside the scope of the present invention. The following may all be cited as non-limiting examples: in the electronics field, BICMOS, bipolar, or As Ga transistors; in the optoelectronics field, the various types of optical gates; and in the chemical field, molecules and their bonds within a macromolecule. While the preferred forms and embodiments of the invention have been illustrated and described, it will be apparent to those of ordinary skill in the art that various changes and modifications may be made without deviating from the inventive concepts and spirit of the invention as set forth above, and it is intended by the appended claims to determine all such concepts which come within the full scope and true spirit of the invention.

Appendix 1

Search procedure

Ph100 as long as NP(OUTPUT) SIGNAL SELECTED
reiterate Ph101

Ph101 if CMOS CUAL(G,output,vss,output,vdd,Q) is true
then
RECORD EQUATION (Output=notQ)

Appendix 2

Procedure CMOS CUAL(G,P1,P2,N1,N2,Q)

Ph201 if DUAL1(G,P1,P2,N1,N2,Q) is true,
   then return true

Ph202 if DUAL2(G,P1,P2,N1,N2,Q) is true,
   then return true
if DUAL2(G,P1,P2,N2,N1,Q) is true,
   then return true Ph203 if DUAL3(G,P1,P2,N1,N2,Q) is true,
   then return true
if DUAL3(G,P2,P1,N1,N2,Q) is true,
   then return true Ph204 if DUAL4(G,P1,P2,N1,N2,Q) is true,
   then return true
if DUAL4(G,P1,P2,N2,N1,Q) is true,
   then return true
if DUAL4(G,P2,P1,N1,N2,Q) is true,
   then return true
if DUAL4(G,P2,P1,N2,N1,Q) is true,
   then return true Ph205 if DUAL5(G,P1,P2,N1,N2,Q) is true,
   then return true
if DUAL5(G,P1,P2,N2,N1,Q) is true,
   then return true
if DUAL5(G,P2,P1,N1,N2,Q) is true,
   then return true
if DUAL5(G,P2,P1,N2,N1,Q) is true then return true Ph206 if not, return false

Appendix 3

Procedure DUAL1(G,P1,P2,N1,N2,Equation)

Ph300

MEMORIZE (G,P1,P2,N1,N2)

Ph301 as long as MOS(G,TrN,TrP) LABELED,
        reiterate PH302
        end at Ph305

Ph302 if NMOS(G,N1,N2,TrN) is true
and PMOS(G,P1,P2,TrP) is true
        then Ph303
        if not Ph304

Ph303

Equation = G
return true

Ph304

RESTORE (TrN,TrP)
RESET (G,P1,P2,N1,N2)

Ph305 return false

Appendix 4

Procedure DUAL2(G,P1,P2,N1,N2,Equation)

Ph400

MEMORIZE (G,P1,P2,N1,N2,Inc,Q)

Ph401 as long as MOS(G,TrN,TrP) LABELED
        reiterate Ph402
        end at Ph405

Ph402 if PMOS(G,P1,P2,TrP) is true
and NMOS(G,N1,Inc,TrN) is true
and CMOS CUAL (G1,P1,P2,Inc,N2,Q) is true
        then Ph403
        if not, Ph404

Ph403

Equation = G and Q
    return true

Ph404

RESTORE (TrN,TrP)
RESET (G,P1,P2,N1,N2,Inc,Q)

Ph405 return false

Appendix 5

Procedure DUAL3(G,P1,P2,N1,N2,Equation)

Ph500

MEMORIZE (G,P1,P2,N1,N2,Jnc,Q)

Ph501 as long as MOS(G,TrN,TrP) LABELED
reiterate Ph502
end at Ph505

Ph502 if NMOS(G,N1,N2,TrN) is true
and PMOS(G,P1,Jnc,TrP) is true
and CMOS CUAL (G1,Jnc,P2,N1,N2,Q) is true
then Ph503
if not Ph504

Ph503

Equation = G or Q
return true

Ph504

RESTORE (TrN,TrP)
RESET (G,P1,P2,N1,N2,Jnc,Q)

Ph505 return false

Appendix 6

Procedure DUAL4((G,P1,P2,N1,N2,Equation)

Ph600

MEMORIZE (G,P1,P2,N1,N2,Inc,Jnc,Q1,Q2)

Ph601 as long as MOS(G,TrN,TrP) LABELED
  reiterate Ph602
  end at Ph605

Ph602 if NMOS(G,N1,Inc,TrN) is true
  and PMOS(G,P1,Jnc,TrP) is true
  and CMOS CUAL (G1,P1,Jnc,Inc,N2,Q1) is true
  and CMOS CUAL (G2,Jnc,P2,N1,N2,Q2) is true
    then Ph603
    if not Ph604

Ph603

Equation = (G and Q1) or Q2
return true

Ph604

RESTORE (TrN,TrP)
RESET (G,P1,P2,N1,N2,Inc,Jnc,Q1,Q2)

Ph605 return false

Appendix 7

Procedure DUAL5(G,P1,P2,N1,N2,Equation)

Ph700

MEMORIZE (G,P1,P2,N1,N2,Inc,Jnc,Q1,Q2)

Ph701 as long as MOS(G,TrN,TrP)LABELED
        reiterate Ph702
        end at Ph705

Ph702 if NMOS(G,Inc,N2,TrN) is true
    and PMOS(G,Jnc,P2,TrP) is true
and CMOS CUAL (G1,P1,Jnc,N1,Inc,Q1) is true
and CMOS CUAL (G2,P1,P2,Inc,N2,Q2) is true
            then Ph703
            if not Ph704

Ph703

Equation = (G or Q1) and Q2
        return true

Ph704

RESTORE (TrN,TrP)
RESET (G,P1,P2,N1,N2,Inc,Jnc,Q1,Q2)

Ph705 return false

I claim:

1. A tool which, according to programmed procedures, automatically produces an abstract specification (SPECRET) which defines functional behavior of a physical system (SYSPHY) from a concrete description (DESCONC), wherein the concrete description defines a structure of the physical system, said tool comprising:

(a) means for associating data in a form of objects (OBJE) with elements of the concrete description;

(b) means for associating structural attribute values of said objects (OBJE) with physical connections of said elements to other elements of said concrete description;

(c) means for regrouping said objects (OBJE) into component objects (OBJC), each of said component objects (OBJC) representing a physical component constituted by said elements of said concrete description associated with said objects (OBJE) regrouped into said component object (OBJC);

(d) means for associating structural attribute values of the component object (OBJC) with said physical connections to elements outside said physical component represented by said component object (OBJC);

(e) means for providing said component object (OBJC) with a functional attribute whose value is a character string which translates the functional behavior of said physical component associated with component object (OBJC) into a formal language;

(f) means for automatically re-using the means defined in (a)–(e) above and replacing regrouped objects (OBJE) and regrouped component objects (OBJC) with new component objects (OBJC), until it is no longer possible to regroup objects (OBJE) or component objects (OBJC) and;

(g) means for concatenating the functional attribute values of the component objects (OBJC) to produce the abstract specification (SPECRET) which defines the functional behavior of the physical system (SYSPHY).

2. The tool as defined in claim 1, further including:

(a) means for regrouping sets (NSMBL) of objects (OBJE) into component objects (OBJC), with the aid of programmed functions, by adding, for each object (OBJC) in a set (NSMBL), one or more objects (OBJCR) constituted by other sets (NSMBL) of the component object (OBJC), said adding being conditional upon a structural layout property (PRPRT) common to the sets (NSMBL), to the component object (OBJC) and to each object (OBJCR); and (b) means for providing the component object (OBJC) with a functional attribute whose value is a function of at least one of said object (OBJCR), said function being determined by said structural layout property (PRPRT).

3. The tool as defined by claim 2, wherein;

(a) said set (NSMBL) represents a transistor (NMOS) and a transistor (PMOS) whose grids are connected at a common point, (b) said structural property (PRPRT) being that an object (OBJCR) represents a circuit including two dual circuits; and (c) the functional attribute value of the physical component object (OBJC) is defined by a logical combination of a grid signal of transistor (NMOS) and transistor (PMOS) and the functional attribute values of the objects (OBJCR).

4. The tool as defined in claim 1, wherein said tool is adapted to be used by a rule construction tool (GND2GRD) to automatically generate a model (OBJM) of a physical component from a structure and from a formal description of the functional behavior of the physical component by subjecting the structure to processing by the tool, the model (OBJM) and the formal description enabling construction of a rule (REG) for the production of objects (OBJC) associated with the physical component.

5. The tool as defined in claim 4, wherein said tool is adapted for use in backward chaining of a process to produce the physical system (SYSPHY) to verify conformity of the physical system produced from an abstract functional specification by comparing a formal description produced to the abstract functional specification.

6. The tool as defined in claim 1, wherein said tool is adapted for use in backward chaining of a process to produce the physical system (SYSPHY) to verify conformity of the physical system produced from an abstract functional specification by comparing a formal description produced to the abstract functional specification.

7. The tool as defined in claim 1, wherein said physical system (SYSPHY) is an electrical circuit.

8. A tool which, according to programmed procedures, automatically produces an abstract specification (SPECRET) which defines the functional behavior of a physical system (SYSPHY) from a concrete description (DESCONC), wherein said concrete description defines a structure of the physical system, said tool comprising;

(a) means for associating a datum in a form of an object (OBJE) with each concrete element of said structure;

(b) means for associating a structural attribute value of said object (OBJE) with each physical connection of each concrete element to another concrete element of said structure;

(c) means for regrouping, with the aid of rules (REG), the objects (OBJE) thus obtained into component objects (OBJC), each component object (OBJC) representing a physical component constituted by said concrete elements of the structure associated with said objects (OBJE) regrouped into said component object (OBJC);

(d) means for associating, using said rules (REG), a structural attribute value of the component object (OBJC) with each physical connection of an element to another element outside said physical component represented by component object (OBJC);

(e) means for providing, using said rules (REG), said component object (OBJC) with a functional attribute whose value is a character string which translates said functional behavior of said physical component represented by said component object (OBJC) into a formal language;

(f) means for automatically activating the means described in (a)–(e) above until said rules are used up, replacing regrouped objects (OBJE) with said component objects (OBJC), said component objects (OBJC) then being considered as new objects (OBJE); and (g) means for concatenating said functional attribute values of remaining objects (OBJE) to produce the abstract specification (SPECRET) which defines the functional operation of the physical system (SYSPHY).

9. The tool as defined in claim 8, wherein said rules (REG) are external data presented with a formalism of an object-oriented language, and have visible structures of a rule which are analog equivalents of internal structures so that said visible structures are handled as objects by the programmed procedures.

10. The tool as defined in claim 9, wherein said means for regrouping the objects (OBJE) into component objects (OBJC) includes a filtering device which selects objects (OBJE) from each rule using error-testing mechanisms with backtracking capability on the objects (OBJE) which satisfy this rule.

11. The tool as defined in claim 10 wherein said rules (REG) have a conditional part which includes a model constituted by a combination of objects (OBJM) of which certain attribute values are initially free variables, said physical system being constituted by a combination of objects (OBJE) whose attribute values are constants, and wherein said variables are instantiated at said constants for the attributes of said combination of objects (OBJM) which are detected as equivalent to the attributes of the objects (OBJE) by a filtering device, and further including a variable unification mechanism for propagating final valves obtained throughout the rule.

12. The tool as defined in claim 10, wherein said physical system (SYSPHY) is an electrical circuit.

13. The tool as defined in claim 9, wherein said rules (REG) have a conditional part which includes a model constituted by a combination of objects (OBJM) of which certain attribute values are initially free variables, said physical system being constituted by a combination of objects (OBJE) whose attribute values are constants, and wherein said variables are instantiated at said constants for the attributes of said combination of objects (OBJM) which are detected as equivalent to the attributes of the objects (OBJE) by a filtering device, and further including a variable unification mechanism for propagating final values obtained throughout the rule.

14. The tool as defined in claim 9, wherein said physical system (SYSPHY) is an electrical circuit.

15. The tool as defined in claim 8, wherein said tool is adapted to be used by a rule construction tool (GND2GRD) to automatically generate a model (OBJM) of a physical component from a structure and from a formal description of the functional behavior of the physical component by subjecting the structure to processing by the tool (OA), the model (OBJM) and the formal description enabling construction of a rule (REG) for the production of objects (OBJC) associated with such a component.

16. The tool as defined in claim 8, wherein said tool is adapted for use in backward chaining of a process to produce the physical system (SYSPHY) to verify conformity of the physical system produced from an abstract functional specification by comparing a formal description produced to the abstract functional specification.

17. The tool as defined in claim 8, wherein said physical system (SYSPHY) is an electrical circuit.

18. A process for producing a physical system SYSPHY comprising the steps of transferring a structured set of elements defined by a concrete description DESCONC of said physical system to material by which said physical system is constructed, wherein said step of transferring is preceded by a first step which establishes an abstract specification of said physical system and by a second step which evaluates the abstract specification, said first step comprising;

(a) associating data in a form of objects with the elements defined by said concrete description;

(b) associating structural attribute values of said objects with physical connections of said elements to other elements defined by said concrete description;

(c) regrouping said objects into component objects (OBJC) each of said component objects (OBJC) representing a physical component constituted by said elements defined by said concrete description with which said objects OBJE regrouped into said component object are associated;

(d) associating a structural attribute value of the component object (OBJC) with said physical connection of each of said elements to an element outside said physical component represented by said component object (OBJC);

(e) providing said component object OBJC with a functional attribute whose value is a character string which translates the functional behavior of the physical component associated with said component object (OBJC) into a formal language;

(f) automatically reiterating steps (a)–(e) described above, considering the component objects (OBJC) obtained previously as objects (OBJE), until it is no longer possible to regroup objects (OBJE) or component objects (OBJC); and (g) concatenating said functional attribute values of resultant component objects (OBJC) to produce the abstract specification (SPECRET).

19. The process for producing a physical system (SYSPHY) according to claim 18, wherein;

(a) when an initial abstract specification (SPECINIT) exists, the concrete description (DESCONC) is obtained by means of a computer-aided design tool (CAD); and (b) said second step includes evaluating the abstract specification (SPECRET) by means of an evaluation tool (COMP) which detects whether the abstract specifications (SPECRET) and (SPECINIT) are identical, in order to authorize the step of transferring the structured set of elements defined by the concrete description (DESCONC) to the material when the abstract specifications (SPECRET) and (SPECINIT) are identical.

20. The process for producing a physical system (SYSPHY) according to claim 18, wherein, when a concrete description (DESCONC) exists;

(a) said second step includes evaluating the abstract specification (SPECRET) by means of an evaluation tool (UPDATE) which enables modification of the abstract specification (SPECRET) in order to produce an initial abstract specification (SPECINIT); and (b) a new concrete description (DESCONC) is obtained by means of a computer-aided design tool (CAD) for obtaining a new physical system (SYSPHY) by transferring a structured set of elements defined by the new concrete description (DESCONC) to the material.

* * * * *